United States Patent
Nishiyama et al.

(10) Patent No.: US 9,385,307 B2
(45) Date of Patent: Jul. 5, 2016

(54) MAGNETORESISTIVE ELEMENT AND METHOD OF MANUFACTURING THE SAME

(71) Applicant: Kabushiki Kaisha Toshiba, Minato-ku, Tokyo (JP)

(72) Inventors: Katsuya Nishiyama, Yokohama Kanagawa (JP); Koji Yamakawa, Yokkaichi Mie (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/643,866

(22) Filed: Mar. 10, 2015

(65) Prior Publication Data

US 2016/0099406 A1    Apr. 7, 2016

Related U.S. Application Data

(60) Provisional application No. 62/058,444, filed on Oct. 1, 2014.

(51) Int. Cl.
*H01L 21/82* (2006.01)
*H01L 43/10* (2006.01)
*H01L 43/12* (2006.01)
*H01L 43/08* (2006.01)
*H01L 43/02* (2006.01)

(52) U.S. Cl.
CPC ............... *H01L 43/10* (2013.01); *H01L 43/12* (2013.01); *H01L 43/02* (2013.01); *H01L 43/08* (2013.01)

(58) Field of Classification Search
CPC ....... H01L 43/08; H01L 43/10; H01L 27/228; B82Y 25/00

USPC ................... 257/421, E29.323; 438/3
See application file for complete search history.

(56) References Cited

U.S. PATENT DOCUMENTS

| 6,256,223 | B1 | 7/2001 | Sun | |
| 2008/0088980 | A1* | 4/2008 | Kitagawa | B82Y 25/00 360/313 |
| 2009/0079018 | A1* | 3/2009 | Nagase | B82Y 25/00 257/421 |

(Continued)

FOREIGN PATENT DOCUMENTS

JP    5429480 B2    2/2014

OTHER PUBLICATIONS

H. Sato, et al, "Perpendicular-anisotropy CoFeB—MgO magnetic tunnel junctions with a MgO/CoFeB/Ta/CoFeB/MgO recording structure", Applied Physics Letters 101, (2012), pp. 022414-1 to 022414-4.

(Continued)

*Primary Examiner* — Brook Kebede
(74) *Attorney, Agent, or Firm* — Holtz, Holtz & Volek PC

(57) ABSTRACT

According to one embodiment, a magnetoresistive element includes a first magnetic layer having a perpendicular and invariable magnetization, a first nonmagnetic insulating layer on the first magnetic layer, a second magnetic layer on the first nonmagnetic insulating layer, the second magnetic layer having a perpendicular and variable magnetization, a second nonmagnetic insulating layer on the second magnetic layer, and a nonmagnetic conductive layer on the second nonmagnetic insulating layer. The second nonmagnetic insulating layer includes a first metal oxide with a predetermined element. The first nonmagnetic insulating layer includes a second metal oxide.

24 Claims, 12 Drawing Sheets

(56) References Cited

U.S. PATENT DOCUMENTS

2010/0176472 A1 7/2010 Shoji
2012/0063220 A1 3/2012 Higo et al.
2012/0175716 A1 7/2012 Bessho et al.
2012/0326252 A1 12/2012 Yamakawa et al.
2013/0069184 A1 3/2013 Aikawa et al.
2013/0163317 A1 6/2013 Yamane et al.

OTHER PUBLICATIONS

S. Ikdea et al, "A perpendicular-anisotropy CoFeB—MgO magnetic tunnel junction", Nature Materials, Jul. 11, 2010, pp. 1-4.

* cited by examiner

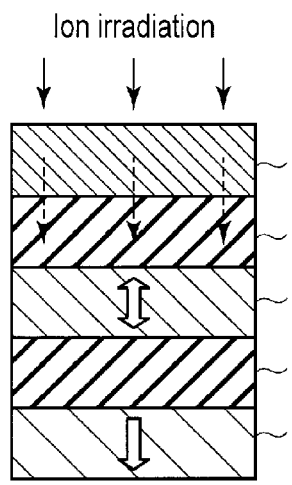
F I G. 8
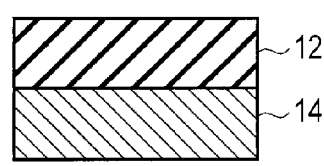
F I G. 9
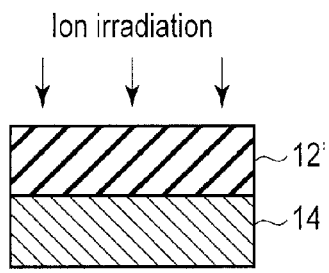
F I G. 10
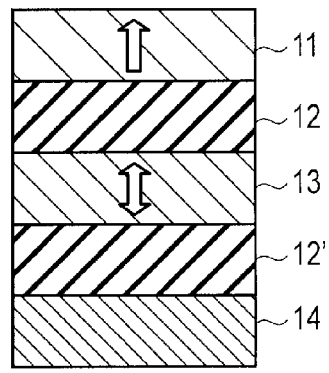
F I G. 11
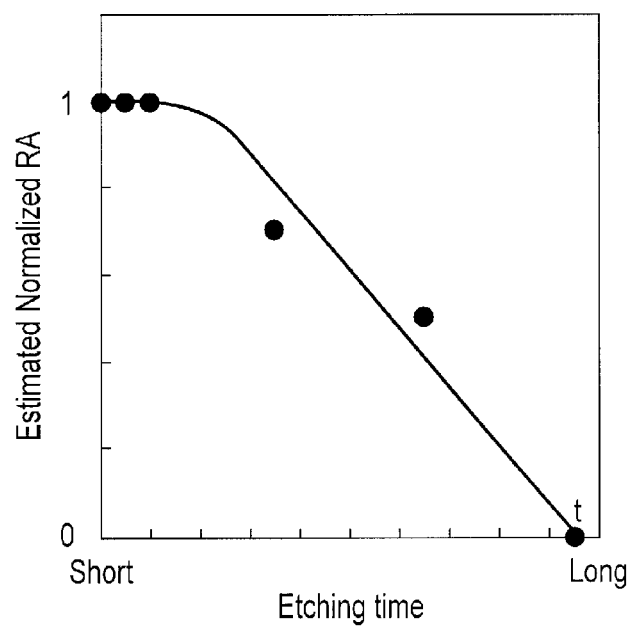
F I G. 12

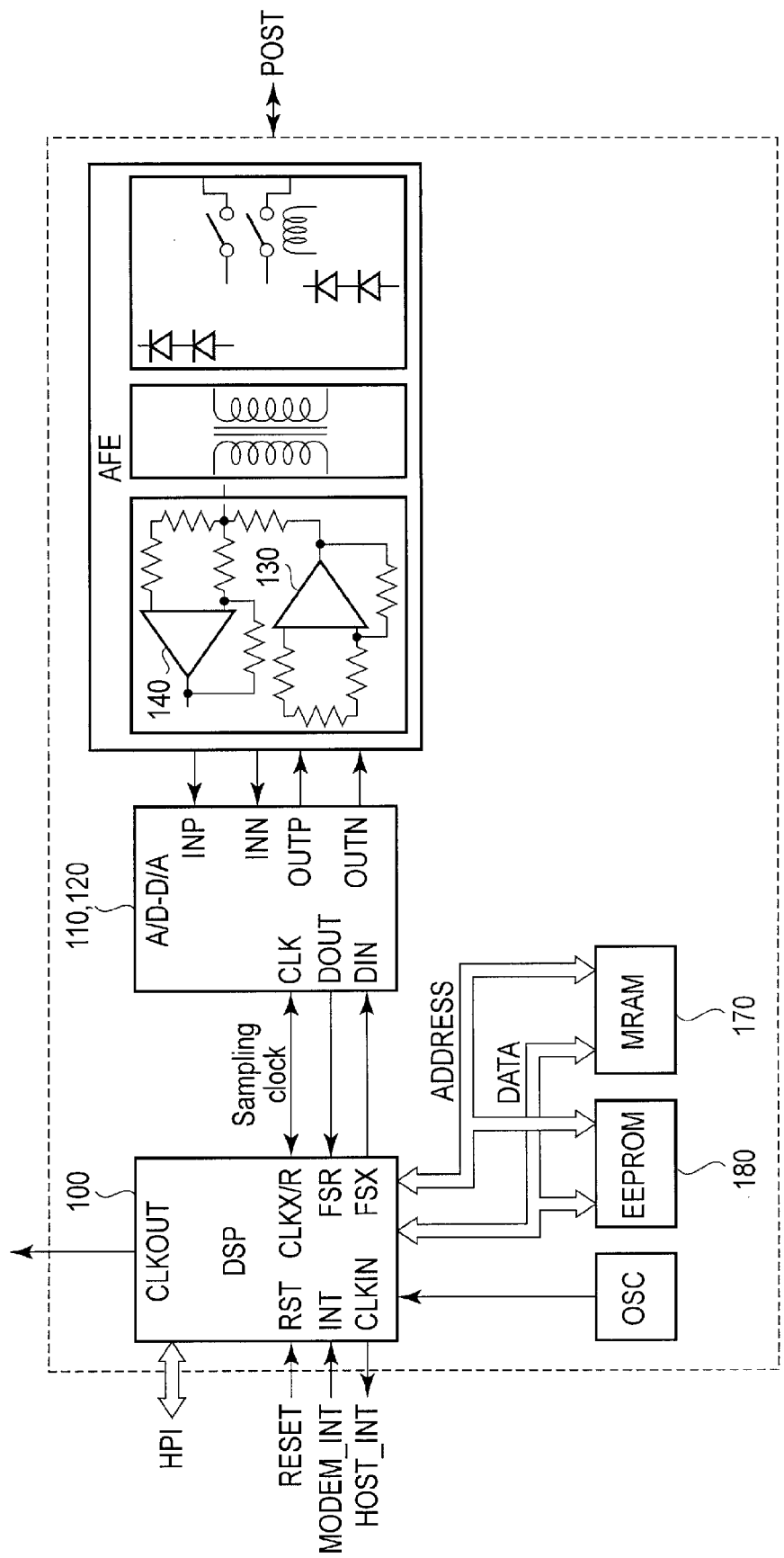
F I G. 16

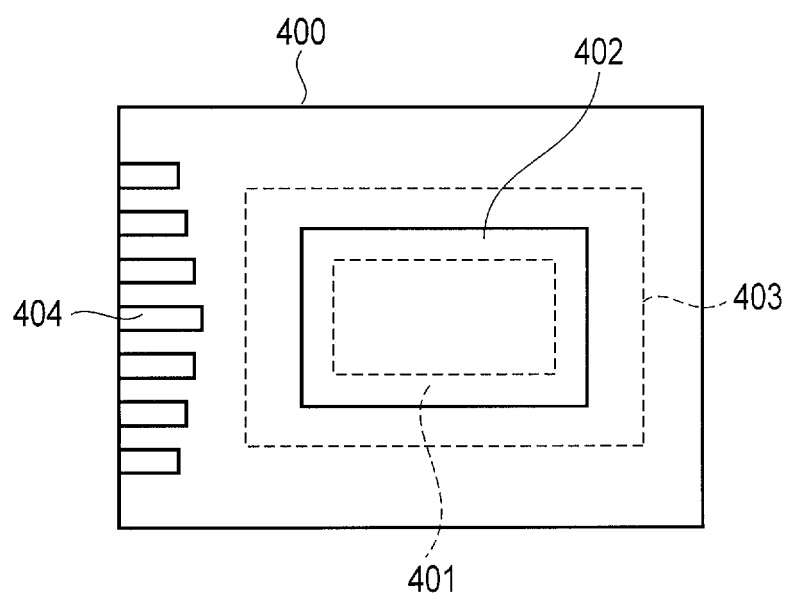
F I G. 18

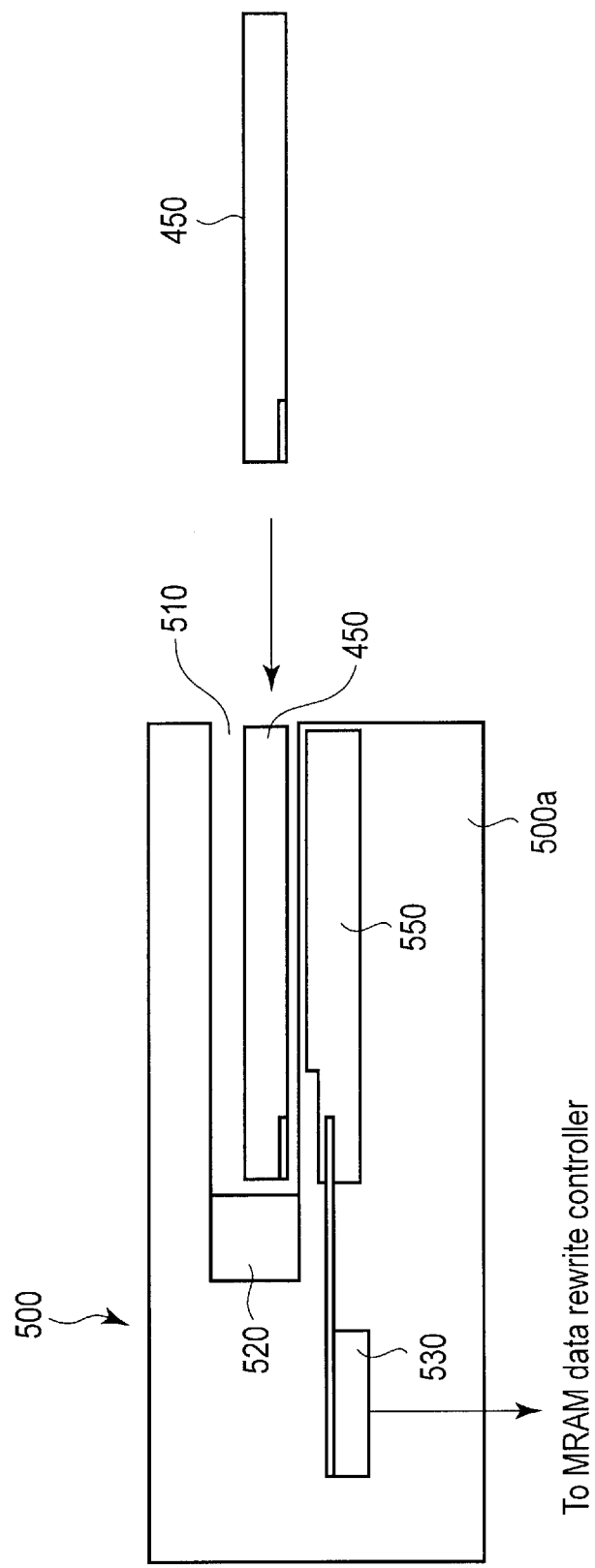
F I G. 20

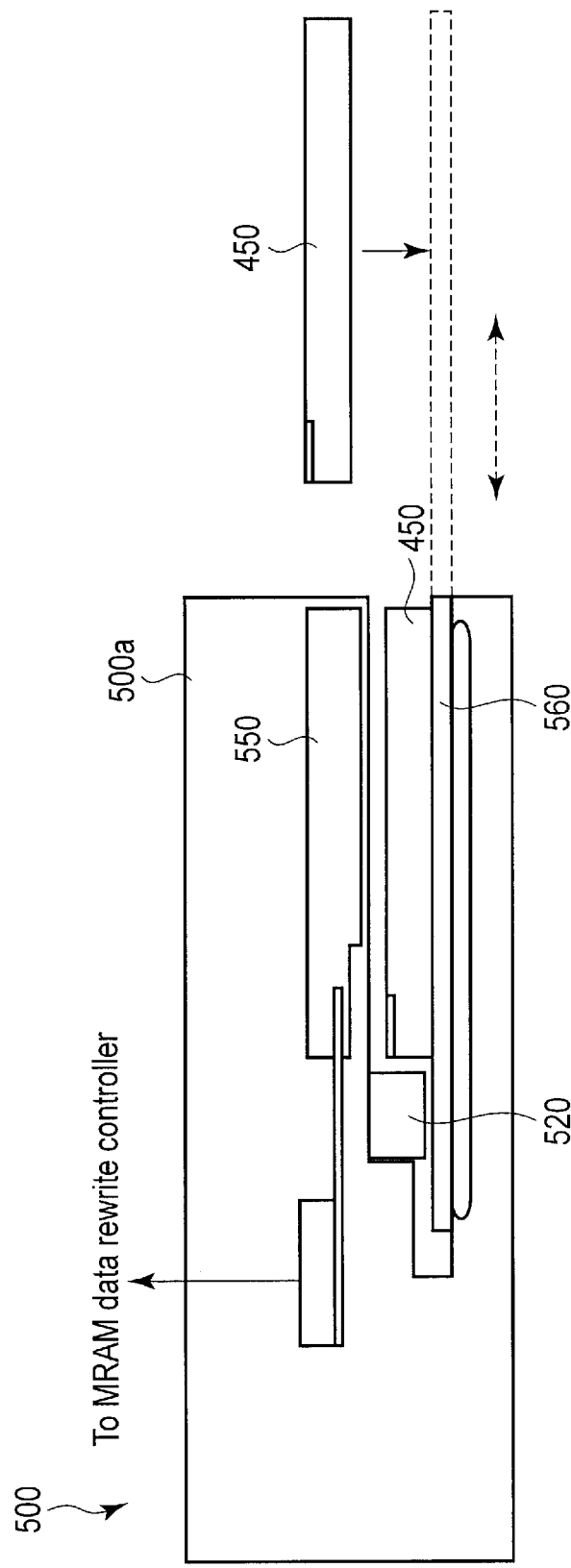
F I G. 22

MAGNETORESISTIVE ELEMENT AND METHOD OF MANUFACTURING THE SAME

CROSS-REFERENCE TO RELATED APPLICATIONS

This application claims the benefit of U.S. Provisional Application No. 62/058,444, filed Oct. 1, 2014, the entire contents of which are incorporated herein by reference.

FIELD

Embodiments described herein relate generally to a magnetoresistive element and a method of manufacturing the same.

BACKGROUND

A magnetoresistive element has as a basic structure a structure comprising a reference layer having invariable magnetization, a storage layer having variable magnetization, and a nonmagnetic layer (tunnel barrier layer) between the reference layer and the storage layer. When the magnetization direction of the reference layer is the same as that of the storage layer, the magnetoresistive element enters a low resistance state (parallel state), and this state will be referred to, e.g., a "0"-write state. On the other hand, when the magnetization direction of the reference is opposite to that of the storage layer, the magnetoresistive element enters a high resistance state (anti-parallel state), and this state will be referred to as, e.g., a "1"-write state.

A write operation for making the magnetoresistive element enter the parallel or anti-parallel state is performed by causing, in the case of adopting, e.g., a spin transfer torque (STT) writing, a write current (spin-polarized electrons) which reverses magnetization of the storage layer to flow in the magnetoresistive element. The STT writing is featured in that when the volume of the storage layer is decreased, the write current is also decreased. It is therefore a promising writing as a method which can achieve miniaturization and decreasing of the current at the same time.

However, if the volume of the storage layer is decreased due to the miniaturization, magnetization posterior to writing easily fluctuates due to an agitation of heat, an external magnetic field or the like, as a result of which the stability (retention) of magnetization of the storage layer which is posterior to writing is worsened.

BRIEF DESCRIPTION OF THE DRAWINGS

FIG. 8 is a cross-sectional view showing a second example of the manufacturing method of the magnetoresistive element as shown in FIG. 1A;

FIGS. 9-11 are cross-sectional views showing an example of a manufacturing method of the magnetoresistive element as shown in FIG. 1B;

FIG. 12 is a view showing a relationship between an etching time and a resistance of a non-magnetic insulating layer;

FIG. 16 is a block diagram showing a DSL data-path portion as an application example;

FIG. 18 is a view showing an MRAM card as an application example; and

FIGS. 19 to 22 are views showing examples of a transfer device which transfers data to the MRAM card.

DETAILED DESCRIPTION

In general, according to one embodiment, a magnetoresistive element comprises: a first magnetic layer having a perpendicular and invariable magnetization; a first nonmagnetic insulating layer on the first magnetic layer; a second magnetic layer on the first nonmagnetic insulating layer, the second magnetic layer having a perpendicular and variable magnetization; a second nonmagnetic insulating layer on the second magnetic layer; and a nonmagnetic conductive layer on the second nonmagnetic insulating layer. The second nonmagnetic insulating layer includes a first metal oxide with a predetermined element. The first nonmagnetic insulating layer includes a second metal oxide.

1. Embodiment

(1) Structure of Magnetoresistive Element

Figure 1A:
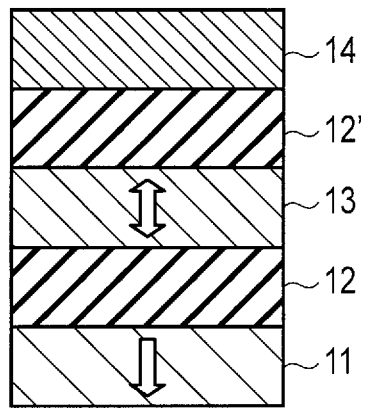
FIGS. 1A and 1B are views showing examples of a magnetoresistive element.
Figure 1B:
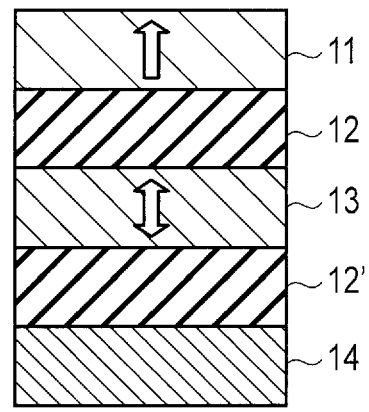

FIGS. 1A and 1B show magnetoresistive elements according to an embodiment.

This embodiment proposes a structure in which in a magnetoresistive element which comprises a magnetic layer (hereinafter referred to as a reference layer) 11 having invariable magnetization, a magnetic layer (hereinafter referred to as a storage layer) 13 having variable magnetization, and a nonmagnetic layer 12 between those magnetic layers, a nonmagnetic insulating layer 12' is also provided on a side of the storage layer 13 which is located opposite to the nonmagnetic insulating layer 12.

The nonmagnetic insulating layers 12 and 12' both contain a metal oxide, for example, a magnesium oxide. Furthermore, the nonmagnetic insulating layer 12' contains predetermined impurities, whereas the nonmagnetic insulating layer 12 contains no predetermined impurities. This is because the nonmagnetic insulating layer 12 is intended mainly to function as a tunnel barrier layer, whereas the nonmagnetic insulating layer 12' is intended to mainly to improve stability of magnetization of the storage layer 13.

It should be noted that the invariable magnetization means that a magnetization direction does not vary before or after writing, and the variable magnetization means that the magnetization direction can vary to be reversed before and after writing. Also, the writing means a spin-transfer writing in which writing current (spin-polarized electrons) are made to flow in a magnetoresistive element, thereby giving a spin torque to the magnetization of the storage layer 13.

In the embodiment, a so-called perpendicular magnetization-magnetoresistive element will be explained by way of example. In the perpendicular magnetization-magnetoresistive element, the magnetization direction of residual magnetization of the reference layer 11 and the storage layer 13 coincides with a direction in which those layers are stacked together (which will be hereinafter referred to as a perpendicular direction).

FIGS. 1A and 1B are views schematically showing magnetoresistive elements, and sizes of elements in the magnetoresistive elements are different from actual ones.

The magnetoresistive element as shown in FIG. 1A is of a so-called top free type. In this magnetoresistive element, the storage layer (free layer) 13 is located in an upper position than the reference layer 11. Thus, the magnetoresistive element is referred to as a top free type magnetoresistive element.

The nonmagnetic insulating layer 12 is located on the reference layer 11; the storage layer 13 is located on the nonmagnetic insulating layer 12; the nonmagnetic insulating layer 12' is located on the storage layer 13, and a nonmagnetic conductive layer 14 is located on the nonmagnetic insulating layer 12'.

The magnetoresistive element as shown in FIG. 1B is of a so-called top pin type.

In this magnetoresistive element, the reference layer (pin layer) 11 is located in an upper position than the storage layer 13. Thus, the magnetoresistive element is referred to as a top pin type magnetoresistive element.

The nonmagnetic insulating layer 12' is located on the nonmagnetic conductive layer 14; the storage layer 13 is located on the nonmagnetic insulating layer 12'; the nonmagnetic insulating layer 12 is located on the storage layer 13; and the reference layer 11 is located on the nonmagnetic insulating layer 12.

In the magnetoresistive elements as shown in FIGS. 1A and 1B, the magnetization direction of residual magnetization of the reference layer 11 is a perpendicular direction. The reference layer 11 includes material having a greater coercive force than that of the storage layer 13, and its magnetization direction is therefore invariable when writing current is made to flow. In the embodiment, although the residual magnetization of the reference layer 11 is directed away from the nonmagnetic insulating layer 12, it may be directed toward the nonmagnetic insulating layer 12.

Figure 2A:
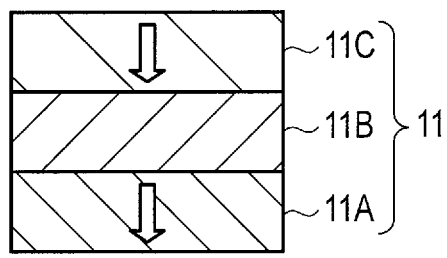
FIGS. 2A and 2B are views showing a modification of a reference layer.
Figure 2B:
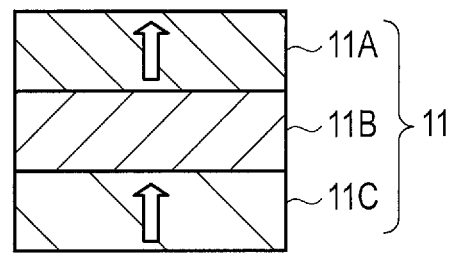

The reference layer 11, as shown in, e.g., FIGS. 2A and 2B, may have a three-layer structure comprising a magnetic layer 11A, a nonmagnetic conductive layer (buffer layer) 11B and a magnetic layer 11C. FIG. 2A is associated with FIG. 1A, and FIG. 2B is associated with FIG. 1B. In this structure, the nonmagnetic conductive layer 11B separates crystal structures of the magnetic layers 11A and 11C from each other, and also, for example, absorbs boron (B) in CoFeB in the case where the magnetic layers 11A and 11B are formed of CoFeB.

Therefore, a crystal matching between the nonmagnetic insulating layer 12 and the magnetic layer 11C in the reference layer 11 is satisfactory, and a high magnetoresistive (MR) ratio can be achieved.

It is preferable that referring to FIGS. 2A and 2B, the nonmagnetic conductive layer 11B be formed of metal which is in an amorphous state and has a thickness smaller than 0.3 nm. As such metal, for example, Ta, Ti, Nb, Pt, W, etc. are present. In this case, for example, the three-layer structure 11A-11C is $(Co_{100-x}Fe_x)_yB_{100-y}/M/(Co_{100-x}Fe_x)_yB_{100-y}$, where x≥50 atmic %, y≥70 atmic %, and M is one of Ta, Ti, Nb, Pt and W.

The magnetization direction of residual magnetization of the storage layer 13 is a perpendicular direction. The storage layer 13 includes material having a smaller coercive force than that of the reference layer 11, and its magnetization direction is therefore variable when the writing current is made to flow.

Figure 3A:
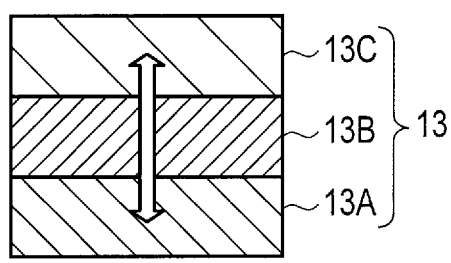
FIGS. 3A and 3B are views showing a modification of a storage layer.
Figure 3B:
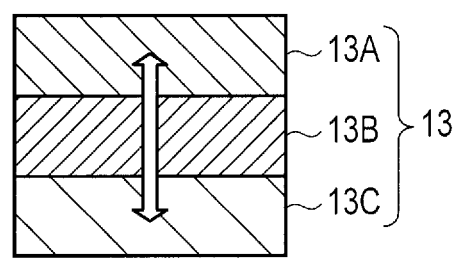

The storage layer 13, for example, as shown in FIGS. 3A and 3B, may have a three-layer structure comprising a magnetic layer 13A, a nonmagnetic conductive layer (buffer layer) 13B and a magnetic layer 13C. FIG. 3A is associated with FIG. 1A, and FIG. 3B is associated with FIG. 1B. In this structure, the nonmagnetic conductive layer 13B separate crystal structures of the magnetic layers 13A and 13C from each other, and for example, absorbs boron (B) in CoFeB in the case where the magnetic layers 13A and 13B are formed of CoFeB.

Therefore, a crystal matching between the nonmagnetic insulating layer 12 and the magnetic layer 13A in the storage layer 13 is satisfactory, and a high magnetoresistive (MR) ratio can be achieved.

It is preferable that referring to FIGS. 3A and 3B, the nonmagnetic conductive layer 13B be formed of metal which is in an amorphous state and has a thickness smaller than 0.3 nm. As such metal, for example, Ta, Ti, Nb, Pt, W, etc. are present. In this case, for example, the three-layer structure 13A-13C is $(Co_{100-x}Fe_x)_yB_{100-y}/M/(Co_{100-x}Fe_x)_yB_{100-y}$, where x≥50 atmic %, y≥70 atmic %, and M is one of Ta, Ti, Nb, Pt and W.

Explaining of the magnetoresistive elements as shown in FIGS. 1A and 1B will be resumed.

The nonmagnetic insulating layer 12 functions as a tunnel barrier layer. Therefore, it is preferable that a thickness t of the nonmagnetic insulating layer 12 in the perpendicular direction be set to satisfy "0.5 nm≤t≤1.2 nm", and for example, it be set to approximately 1 nm. Also, it is preferable that a resistance of the nonmagnetic insulating layer 12 be 0.5 $\mu\Omega cm^2$ or less.

Furthermore, it is preferable that the nonmagnetic insulating layer 12 be formed of a metal oxide having a (001) oriented NaCl structure in the perpendicular direction, in order to improve the MR ratio of the magnetoresistive element. For example, the nonmagnetic insulating layer 12 is formed of material which can be selected from a group consisting of MgO, CaO, SrO, TiO, VO and NbO.

A crystal matching between the above materials and CoFeB which is applied to, e.g., the reference layer 11 and the storage layer 13 is easily achieved, and thus a high MR ratio can be obtained.

The nonmagnetic insulating layer 12' functions as a magnetization stabilization layer to improve the stability of magnetization of the storage layer 13. It should be noted that for example, a retention index (A value) is present as an index indicating a magnetization stability of the storage layer 13. The Δ value is a ratio between an anisotropy energy E1 and a thermal energy E2 of the storage layer 13 (E1/E2). The greater the Δ value, the more stable the magnetization of the storage layer 13 becomes.

In recent years, magnetoresistive elements have been made more minute, and as a result magnetic layers 13 have tended to have a smaller volume. This means that the storage layers 13 have tended to have a smaller anisotropy energy. This tendency is not desirable for the stability of magnetization of the storage layers 13.

For the above reason, it is hoped that a new technique will be provided to improve the stability of magnetization of the storage layer 13. In order to improve the stability of magnetization thereof, it is the simplest method that the volume of the storage layer 13 is increased (the anisotropy energy E1 is increased) by increasing the thickness of the storage layer 13 in the perpendicular direction.

However, the above case gives rise to a new problem in which it is difficult that the magnetization direction of residual magnetization of the storage layer 13 is maintained in the perpendicular direction simply by increasing the thickness of the storage layer 13. This is because a perpendicular anisotropy energy of the storage layer 13 is generated mainly by an interfacial effect between the nonmagnetic insulating layer 12 and the storage layer 13.

In view of the above, in the embodiment, the nonmagnetic insulating layer 12' is provided on a side of the storage layer 13 which is located opposite to the nonmagnetic insulating layer 12, so that the perpendicular magnetization of the storage layer 13 can be maintained even if the thickness of the storage layer 13 is increased in the perpendicular direction in order to increase the Δ value.

It should be noted that the nonmagnetic insulating layer 12' contain the same material (metal oxide) as the nonmagnetic insulating layer 12 contains.

Figure 4:
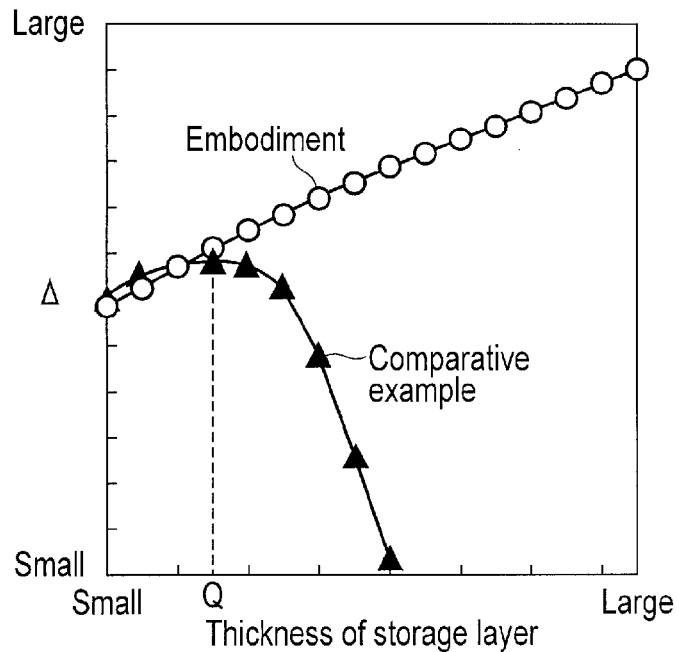
FIG. 4 is a view showing a relationship between a Δ value and the thickness of the storage layer.

FIG. 4 shows a relationship between a retention index (Δ value) and a thickness of each of the storage layers 13 in the perpendicular direction as shown in FIGS. 1A and 1B.

With respect to the embodiment, "○" indicates a relationship between the retention index (Δ value) and the thickness of each of the storage layers 13 in the perpendicular direction as shown in FIGS. 1A and 1B when the structures as shown in FIGS. 1A and 1B are applied as they are. With respect to a comparative example, "▲" indicates a relationship between a relationship between the retention index (Δ value) and the thickness of each of storage layers 13 in the perpendicular direction, in the case where the nonmagnetic insulating layers 12' are omitted from the structures as shown in FIGS. 1A and 1B.

As is clear from FIG. 4, in the embodiment, the greater the thickness of the storage layer 13 in the perpendicular direction, the greater the Δ value, which indicates the stability of magnetization of the storage layer 13 after writing. This can be considered to result from the following two advantages: the anisotropy energy E1 is improved due to increasing of the volume of the storage layer 13; and even if the thickness of the storage layer 13 is increased, the perpendicular magnetization of the storage layer 13 is maintained due to the interfacial effect between the storage layer 13 and the nonmagnetic insulating layers 12 and 12' between which the storage layer 13 is sandwiched.

On the other hand, in the comparative example, in the case where the thickness of the storage layer 13 in the perpendicular direction is a value smaller than a given value Q, the greater the thickness of the storage layer 13, the greater the Δ value, which indicates the stability of magnetization of the storage layer 13 after writing. This seems to be because the anisotropy energy E1 is increased due to increasing of the volume of the storage layer 13.

However, in the comparative example, in the case where the thickness of the storage layer 13 is a value greater than the given value Q, the greater the thickness of the storage layer 13, the smaller the Δ value, which indicates the stability of magnetization of the storage layer 13 after writing. This seems to be because in the case where the thickness is a value greater than the given value Q, an effect of maintaining the perpendicular magnetization of the storage layer 13 due to the interfacial effect between the nonmagnetic insulating layer 12 and the storage layer 13 is reduced.

That is, since it becomes impossible to maintain the perpendicular magnetization of the storage layer 13, the Δ value cannot be increased even if the volume of the storage layer 13 is increased.

In such a manner, according to the embodiment, it is possible to increase the thickness (volume) of the storage layer while maintaining the perpendicular magnetization of the storage layer 13. Thus, even if the magnetoresistive element is made more minute, and as a result an in-plane size of the magnetoresistive element (which is a size thereof in a direction perpendicular to the perpendicular direction) is decreased, e.g., even if the in-plane size is smaller than 30 nm, the stability of magnetization of the storage layer 13 (i.e., the Δ value) can be increased by increasing the thickness of the storage layer 13.

It should be noted that in a structure related to the above embodiment, the nonmagnetic insulating layers 12 and 12' are used. This gives rise to a problem in which the MR ratio of the magnetoresistive element lowers due to the resistance of the nonmagnetic insulating layer 12' newly added.

In view of the above, in order that the resistance of the nonmagnetic insulating layer 12' be lowered, and a high retention index (Δ value) and a high MR ratio be achieved at the same time, it is proposed as a structure in that the nonmagnetic insulating layer 12' contains predetermined impurities. It should be noted that the nonmagnetic insulating layer 12 does not contain predetermined impurities, since it is made to function as a tunnel barrier layer. Therefore, the nonmagnetic insulating layer 12' has a lower resistance than that of the nonmagnetic insulating layer 12.

The predetermined impurities are implanted to lower the resistance of the nonmagnetic insulating layer 12'.

For example, any of the following processes is effective to reduce the resistance of the nonmagnetic insulating layer 12': predetermined impurities are ion-implanted into the nonmagnetic insulating layer 12'; part of the nonmagnetic insulating layer 12' is caused by ion irradiation of predetermined impurities to be in an amorphous state in which an oxygen loss occurs; and the roughness of the nonmagnetic insulating layer 12' is caused by ion irradiation of predetermined impurities to be larger than that of the nonmagnetic insulating layer 12.

(2) Manufacturing Method of Magnetoresistive Element

Figures 5, 6, 7:
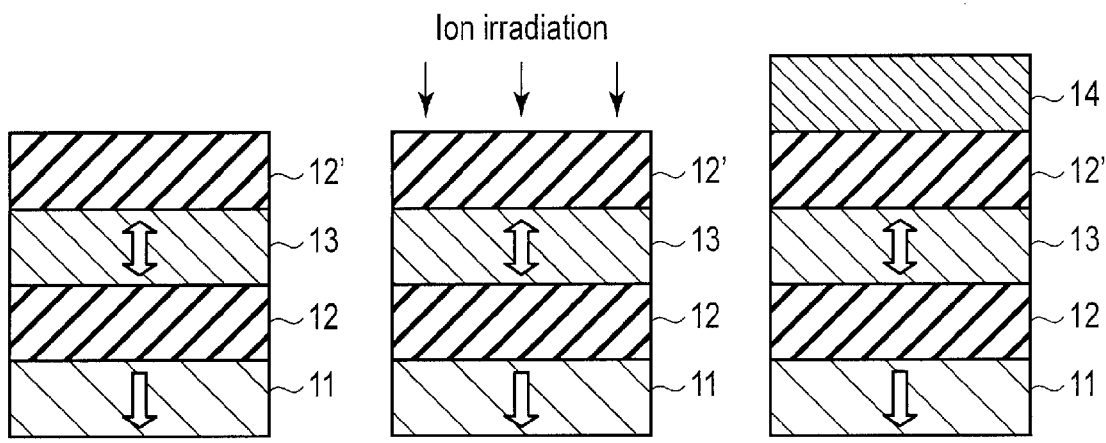
FIGS. 5-7 are cross-sectional views showing a first example of a manufacturing method of the magnetoresistive element as shown in FIG. 1A.

FIGS. 5-7 show a first example of the manufacturing method of the magnetoresistive element as shown in FIG. 1A.

First, as shown in FIG. 5, a nonmagnetic insulating layer (tunnel barrier layer) 12 is formed on a reference layer 11; a storage layer 13 is formed on the nonmagnetic insulating layer 12; and a nonmagnetic insulating layer 12' is formed on the storage layer 13.

Next, as shown in FIG. 6, the inside of the nonmagnetic insulating layer 12' is subjected to ion irradiation of predetermined impurities, to thereby cause the resistance of the nonmagnetic insulating layer 12' to be smaller than that of the nonmagnetic insulating layer 12.

For example, if impurities such as P or As are ion-implanted into the nonmagnetic insulating layer 12', the resistance of the nonmagnetic insulating layer 12' can be made small.

Also, if the surface of the nonmagnetic insulating layer 12' is subjected to ion irradiation of impurities such as Ar, Xe or Kr to cause part of the nonmagnetic insulating layer 12' to be in an amorphous state in which an oxygen loss occurs, the resistance of the nonmagnetic insulating layer 12' can be made small.

Furthermore, if the surface of the nonmagnetic insulating layer 12' is subjected to ion irradiation of impurities such as Ar, Xe or Kr, the roughness of the surface of the nonmagnetic insulating layer 12' becomes larger than that of the nonmagnetic insulating layer 12, and the resistance of the nonmagnetic insulating layer 12' can thus be made small.

The last two of the three examples as described above can be each applied as an etching process in which the nonmagnetic insulating layer 12' is partially etched with impurities such as Ar, Xe or Kr, for example, as an inverse sputter process.

In the above etching process, ions of the impurities such as Ar, Xe or Kr exert an ion implantation effect in addition to an etching effect, and as a result cause the nonmagnetic insulating layer 12' to contain the impurities such as Ar, Xe or Kr.

Finally, a nonmagnetic conductive layer (cap layer) 14 is formed on the nonmagnetic insulating layer 12'.

By virtue of the above, the magnetoresistive element as shown in FIG. 1A is completely formed.

FIG. 8 shows a second example of the manufacturing method of the magnetoresistive element as shown in FIG. 1A.

First, a nonmagnetic insulating layer (tunnel barrier layer) 12 is formed on a reference layer 11; a storage layer 13 is formed on the nonmagnetic insulating layer 12; a nonmagnetic insulating layer 12' is formed on the storage layer 13; and a nonmagnetic conducive layer (cap layer) 14 is formed on the nonmagnetic insulating layer 12'.

Thereafter, the inside of the nonmagnetic insulating layer 12' is subjected to ion irradiation of predetermined impurities from a position located above the nonmagnetic conductive layer 14, to thereby cause the resistance of the nonmagnetic insulating layer 12' to be smaller than that of the nonmagnetic insulating layer 12. This ion irradiation is the same as the ion irradiation (three examples) of the first example of the manufacturing process as shown in FIGS. 5-7, and its explanation will thus be omitted.

However, since the above ion irradiation is carried out from the position above the nonmagnetic conductive layer 14, the nonmagnetic insulating layer 12' is made to contain impurities (e.g., Pt, W, Ta or Ru) contained in the nonmagnetic conductive layer 14, in addition to the impurities (e.g., Ar, Xe or Kr) applied in the ion irradiation.

By virtue of the above, the magnetoresistive element as shown in FIG. 1A is completely formed.

FIGS. 9-11 show an example of a manufacturing method of the magnetoresistive element as shown in FIG. 1B.

First, as shown in FIG. 9, a nonmagnetic insulating layer 12' is formed on a nonmagnetic conducive layer (underlying layer) 14. Then, as shown in FIG. 10, the inside of the nonmagnetic insulating layer 12' is subjected to ion irradiation of predetermined impurities, to thereby reduce the resistance of the nonmagnetic insulating layer 12'. This ion irradiation is the same as the ion irradiation (three examples) of the first example of the manufacturing method as shown in FIGS. 5-7, and its explanation will thus be omitted.

Finally, as shown in FIG. 11, a storage layer 13 is formed on the nonmagnetic insulating layer 12'; a nonmagnetic insulating layer (tunnel barrier layer) 12 is formed on the storage layer 13; and a reference layer 11 is formed on the nonmagnetic insulating layer 12.

By virtue of the above, the magnetoresistive element as shown in FIG. 1B is completely formed.

FIG. 12 shows a relationship between an etching time and a resistance of the nonmagnetic insulating layer.

It should be noted that the above nonmagnetic insulating layer corresponds to each of the nonmagnetic insulating layers 12' as shown in FIGS. 1A and 1B.

The above relationship is a relationship between the etching time and the resistance of the nonmagnetic insulating layer in the case where in the three manufacturing methods as described above, the nonmagnetic insulating layer is partially etched by irradiation of Ar ions, and the resistance of the nonmagnetic insulating layer is made low.

A horizontal axis indicates the etching time (irradiation time of Ar ions). A vertical axis indicates a standardized resistance of the nonmagnetic insulating layer, and the resistance obtained when the etching time is 0 is standardized at 1. Furthermore, the resistance of the nonmagnetic insulating layer indicated by the vertical axis is a resistance RA in the case where the area of the nonmagnetic insulating layer in an in-plane direction perpendicular to a direction in which the reference layer and the storage layer are stacked together is set to a predetermined value (e.g., 1 $\mu m^2$).

As is clear from FIG. 12, the resistance of the nonmagnetic insulating layer decreases as the etching time increases. Finally, the resistance of the nonmagnetic insulating layer is made substantially zero at time t. However, an etching rate of the nonmagnetic insulating layer is very low, and a physical thickness of the nonmagnetic insulating layer is substantially the same as that in the case where the nonmagnetic insulating layer has not yet been etched.

The above means that only the resistance of the nonmagnetic insulating layer is reduced, while the thickness thereof prior to the etching is maintained. This seems to be because it is possible that due to an ion implantation effect of Ar ions, only a crystal structure of the nonmagnetic insulating layer is broken without changing the thickness thereof; that is, it is possible that the nonmagnetic insulating layer is made in an amorphous state in which an oxygen loss occurs.

In such a manner, since the resistance of the nonmagnetic insulating layer can be made substantially zero, the MR ratio of the magnetoresistive element, which comprises the reference layer, the tunnel barrier layer and the storage layer, is not lowered. In addition, even if such a nonmagnetic insulating layer is made amorphous, the interfacial effect between the nonmagnetic insulating layer and the storage layer is not lost. It is therefore also possible to improve the retention index (Δ value) by increasing the thickness of the nonmagnetic insulating layer.

(3) Examples of Material

Referring to FIGS. 1A and 1B, the reference layer 11 and the storage layer 12 contain any of Co, Fe, Ni and Mn which are magnetic materials. Also, the reference layer 11 and the storage layer 12 may contain oxygen (O). In this case, the amount of oxygen may be varied in the reference layer 11 and the storage layer 12.

The reference layer 11 and the storage layer 12 may include, e.g., CoFeB, MgFeO, a lamination of CoFeB and MgFeO, or the like.

In the magnetoresistive element having perpendicular magnetization, it is preferable that the reference layer 11 and the storage layer 12 include TbCoFe having perpendicular magnetic anisotropy, an artificial lattice in which Co and Pt are stacked together, FePt having an $L1_o$ structure, etc.

2. Application Examples (1) Magnetic Random Access Memory (MRAM)

Figure 13:
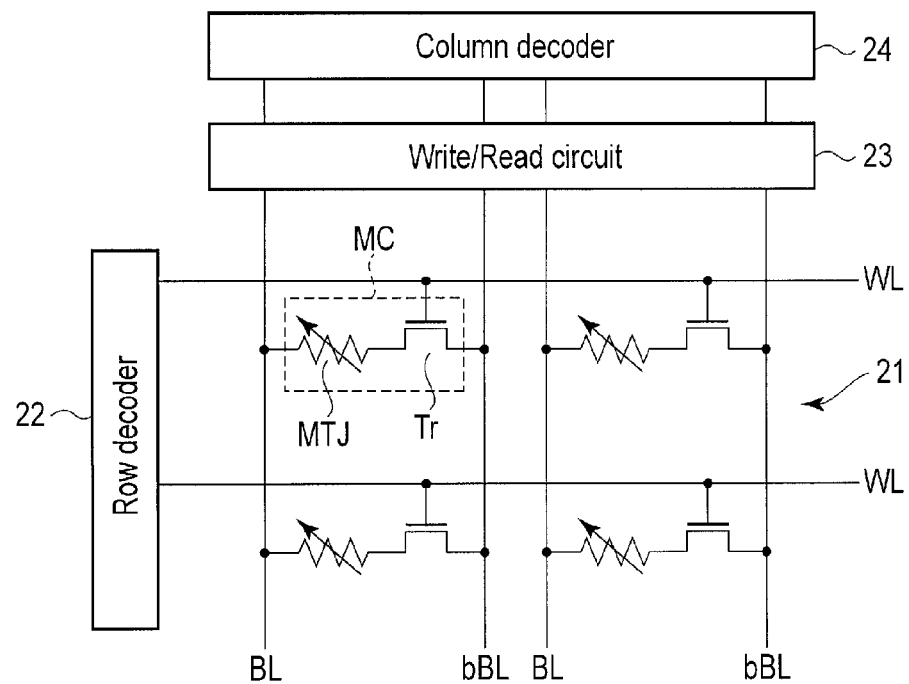
FIG. 13 is a circuit diagram showing a main portion of an MRAM which is an application example.

FIG. 13 shows an MRAM.

The MRAM comprises a memory cell array 21 including a plurality of memory cells MC arranged in a matrix. The memory cell array 21 also includes a plurality of pairs of bit lines BL and bBL extending in a column direction and a plurality of word lines WL extending in a row direction.

At intersections of the pairs of bit lines BL and bBL and the word lines WL, the memory cells MC are provided. Each of the memory cells MC comprises a magnetoresistive element MTJ and a switch element (e.g., an N-channel MOS transistor) Tr which are connected in series.

To be more specific, in each of the memory cells MC, a first terminal is connected to a bit line BL, and a second terminal is connected to a bit line bBL. A control terminal (e.g., a gate of an N-channel MOS transistor) for determining ON/Off of a switch element Tr is connected to a word line WL.

To ends of the word lines WL on one end side thereof, a row decoder 22 is connected. To ends of a pair of bit lines BL and bBL on one end side thereof, a write/read circuit 23 is connected. To the write/read circuit 23, a column decoder 24 is connected. Each of the memory cells MC is selected by the row decoder 22 and the column decoder 24.

Data is written to a memory cell in the following manner:

First, a word line WL connected to a selected memory cell MC to which data is to be written is activated to turn on a switch element Tr in the selected memory cell MC.

The direction of write current (bidirectional current) Iw to flow in a magnetoresistive element MTJ is determined in accordance with write data.

For example, when data "0" is written, write current Iw, which will flow from a bit line BL toward a bit line bBL, is supplied to the magnetoresistive element MTJ. In this case, it suffices that a write circuit applies a positive voltage to the bit line BL, and also a ground voltage to the bit line bBL.

Furthermore, when data "1" is written, write current Iw, which will flow from the bit line bBL toward the bit line BL, is supplied to the magnetoresistive element MTJ. In this case, it suffices that the write circuit applies a positive voltage to the bit line bBL, and also a ground voltage to the bit line BL.

In such a manner, data "0" or data "1" can be written to the selected memory cell MC.

Next, data is read from a memory cell MC as follows:

First, a switch element Tr in a selected memory cell MC is turned on. A read circuit causes read current Ir to flow in the magnetoresistive element MTJ. Then, the read circuit detects a resistance value of the magnetoresistive element MTJ in the selected memory MC on the basis of the read current Ir. In such a manner, data stored in the magnetoresistive element MTJ can be read.

It should be noted that although the direction of the read current Ir is not especially limited, it is necessary that the value of the read current Ir is sufficiently smaller than that of the write current Iw in order to prevent writing from being performed by mistake at the time of performing reading.

Next, a device structure of each of memory cells in the MRAM will be explained.

Figure 14:
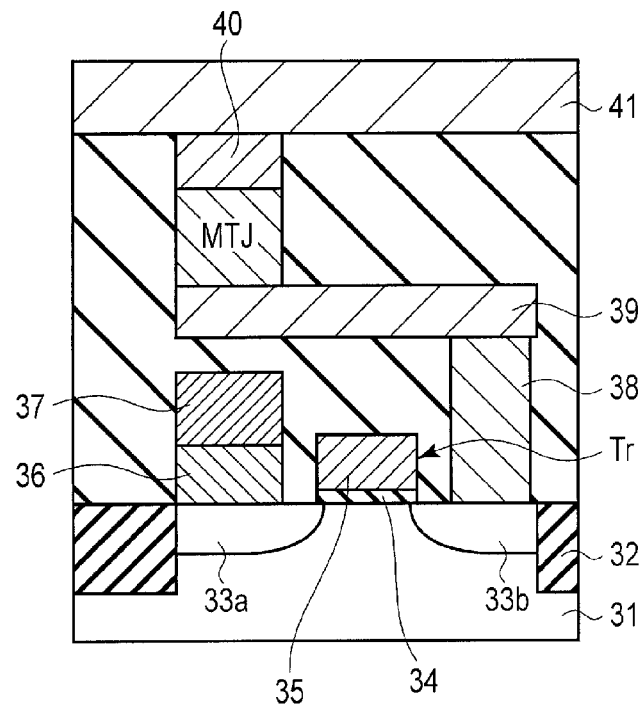
FIG. 14 is a cross-sectional view showing a memory cell in the MRAM.

FIG. 14 shows a device structure of a memory cell.

In a surface region of a semiconductor substrate 31, an element isolation region (element isolation insulating layer STI) 32 is provided, and a switch element Tr is provided in an element area (active area) surrounded by the element isolation region 32. The element isolation region 32 includes, for example, an oxide silicon having a shallow trench isolation (STI) structure.

In the element region, a source region 33a and a drain region 33b are provided. The source region 33a and the drain region 33b are, for example, N+-type impurity diffusion regions in a P-type semiconductor substrate 31. On part of the semiconductor substrate 31 which is located between the source region 33a and the drain region 33b, a gate electrode 35 is provided, with a gate insulating layer 34 interposed between the gate electrode 35 and the above part. The gate electrode 35 functions as a word line WL.

On the source region 33a, a conductive line 37 is provided, with a contact plug 36 interposed between the conductive line 37 and the source region 33a. The conductive line 37 functions as a bit line bBL. On the drain region 33b, a lower electrode 39 is provided, with a contact plug 38 interposed between the lower electrode 39 and the drain region 33b. On the lower electrode 39, for example, the magnetoresistive element MTJ as shown in FIG. 1A or 1B is provided.

In the above example, an upper electrode 40 is provided on the magnetoresistive element MTJ. The upper electrode 40 functions as a hard mask layer at the time of patterning the magnetoresistive element MTJ, and also as a protection layer which protects the magnetoresistive element MTJ. On the upper electrode 40, a conductive line 41 is provided. The conductive line 41 functions as a bit line BL.

Furthermore, a gap between the semiconductor substrate 31 and the conductive line 41 is filled with an interlayer insulating layer such as an oxide silicon.

Figure 15A:
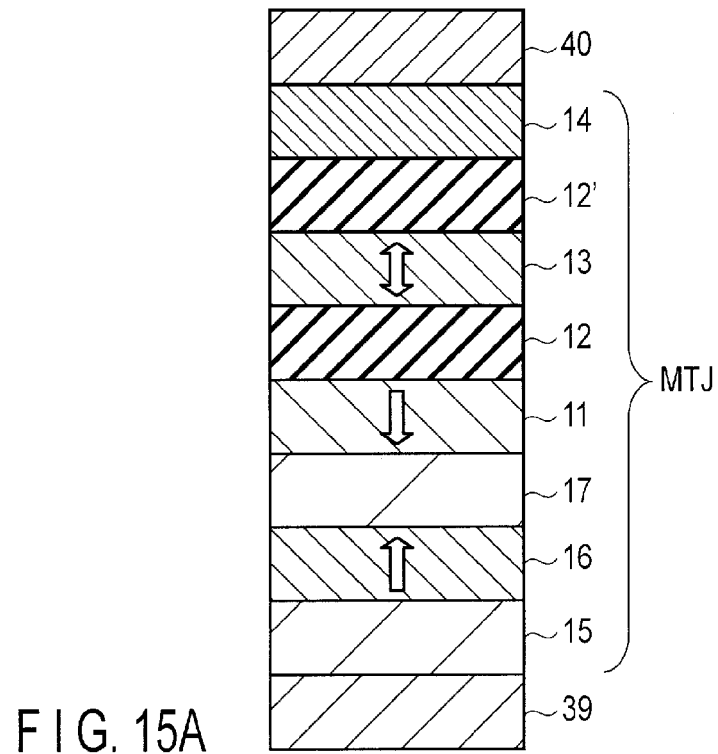
FIGS. 15A and 15B are cross-sectional views showing examples of a magnetoresistive element.
Figure 15B:
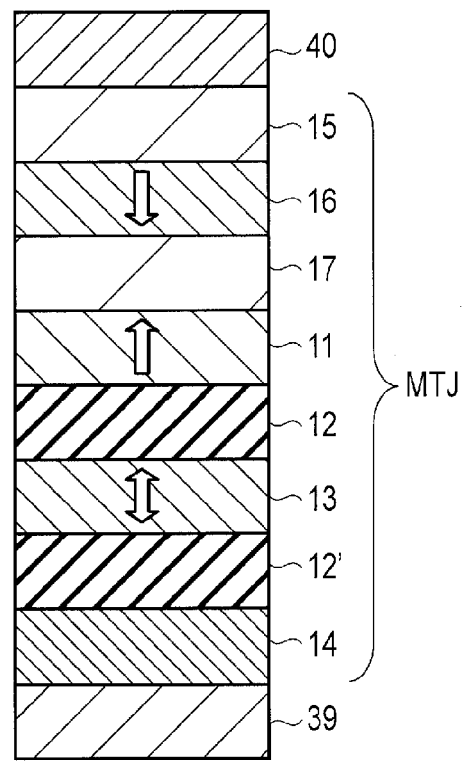

FIGS. 15A and 15B show examples of the magnetoresistive element MTJ as shown in FIGS. 13 and 14.

The magnetoresistive element MTJ as shown in FIG. 15A is an application example in which the magnetoresistive element (top free type) as shown in FIG. 1A is applied to the memory cell in the MRAM as shown in FIGS. 13 and 14.

In this example, a nonmagnetic conductive layer (underlying layer) 15 is provided on a lower electrode 39; a magnetic layer 16 is provided on the nonmagnetic conductive layer 15; a nonmagnetic conductive layer 17 is provided on the magnetic layer 16; and the reference layer 11 is provided on the nonmagnetic conductive layer 17. Furthermore, a nonmagnetic insulating layer (tunnel barrier layer) 12 is provided on a reference layer 11; a storage layer 13 is provided on the nonmagnetic insulating layer 12; a nonmagnetic insulating layer 12' is provided on the storage layer 13; a nonmagnetic conducive layer (cap layer) 14 is provided on the nonmagnetic insulating layer 12'; and an upper electrode 40 is provided on the nonmagnetic conductive layer 14.

The magnetic layer 16 has perpendicular and invariable magnetization. Also, the magnetization direction of the magnetic layer 16 is opposite to that of the reference layer 11. That is, in this example, the magnetization direction of the reference layer 11 is a (downward) direction away from the nonmagnetic insulating layer 12, and the magnetization direction of the magnetic layer 16 is a (upward) direction toward the nonmagnetic insulating layer 12.

The magnetic layer 16 functions as a shift cancel layer which cancels a shift of a magnetization reversal characteristic of the storage layer 13. That is, the magnetic layer 16 generates a second stray magnetic field which is opposite to a first stray magnetic field generated by the reference layer 11. The first and second stray magnetic fields cancel each other, and can thus cancel the shift of the magnetization reversal characteristic of the storage layer 13.

It is preferable that the reference layer 11 and the magnetic layer (shift cancel layer) 16 be coupled to each other by synthetic anti-ferromagnetic (SAF) coupling. In the above example, the nonmagnetic conductive layer 17 is provided between the reference layer 11 and the magnetic layer 16; however, the nonmagnetic conductive layer 17 can also be omitted.

The magnetoresistive element MTJ as shown in FIG. 15B is an application example in which the magnetoresistive element (top pin type) as shown in FIG. 1B is applied to the memory cell in the MRAM as shown in FIGS. 13 and 14.

In this example, a nonmagnetic conductive layer (underlying layer) 14 is provided on a lower electrode 39; a nonmagnetic insulating layer 12' is provided on the nonmagnetic conductive layer 14; a storage layer 13 is provided on the nonmagnetic insulating layer 12'; and a nonmagnetic insulating layer (tunnel barrier layer) 12 is provided on the storage layer 13. Furthermore, a reference layer 11 is provided on the nonmagnetic insulating layer 12; a nonmagnetic conductive layer 17 is provided on a reference layer 11; a magnetic layer 16 is provided on the nonmagnetic conductive layer 17; a nonmagnetic conductive layer (cap layer) 15 is provided on the magnetic layer 16; and an upper electrode 40 is provided on the nonmagnetic conductive layer 15.

The magnetic layer 16 has perpendicular and invariable magnetization. The magnetization direction of the magnetic layer 16 is opposite to the reference layer 11. That is, in this example, the magnetization direction of the reference layer 11 is a (upward) direction away from the nonmagnetic insulating layer 12, and the magnetization direction of the magnetic layer 16 is a (downward) direction toward the nonmagnetic insulating layer 12.

The magnetic layer 16 functions as a shift cancel layer which cancel a shift of a magnetization reversal characteristic of the storage layer 13. That is, the magnetic layer 16 generates a second stray magnetic field opposite to a first stray magnetic field generated by the reference layer 11. The first and second stray magnetic fields cancel each other, and can thus cancel the shift of the magnetization reversal characteristic of the storage layer 13.

It is preferable that the reference layer 11 and the magnetic layer (sift cancel layer) 16 be coupled to each other by the SAF coupling. In the above example, the nonmagnetic conductive layer 17 is provided between the reference layer 11 and the magnetic layer 16; however, the nonmagnetic conductive layer 17 can also be omitted.

As explained in detail above, it is possible to form a magnetic memory, e.g., an MRAM by applying the magnetoresistive element MTJ according to the embodiment.

(2) Application Examples of MRAM

The above MRAM can be applied to various electronic devices. Application examples of the MRAM will be explained.

[DSL Data-Path Portion of Modem for DSL]

FIG. 16 shows a digital subscriber line (DSL) data-path portion in a modem for DSL.

The modem comprises a programmable digital signal processor (DSP) 100, an analog-digital (A/D) converter 110, a digital-analog (D/A) converter 129, a transmission driver 130 and a reception amplifier 140.

Referring to FIG. 16, a band-pass filter is omitted, and instead, a MRAM 170 and an EEPROM 180 are provided. Those memories function as option memories for holding a line code program. It should be noted that the line code program is a program for causing a modem to be selected or operated in accordance with a subscriber line information executed by the DSP or coded, transmission conditions (line code: QAM, CAP, RSK, FM, AM, PAM, DWMT, etc.), etc.

In the above application example, although the MRAM 170 and the EEPROM 180 are used as memories for holding the line code program, the EEPROM 180 may be replaced by an MRAM. That is, only MRAMs can be applied as the memories for holding the line code program.

[Portable Telephone Terminal]

Figure 17:
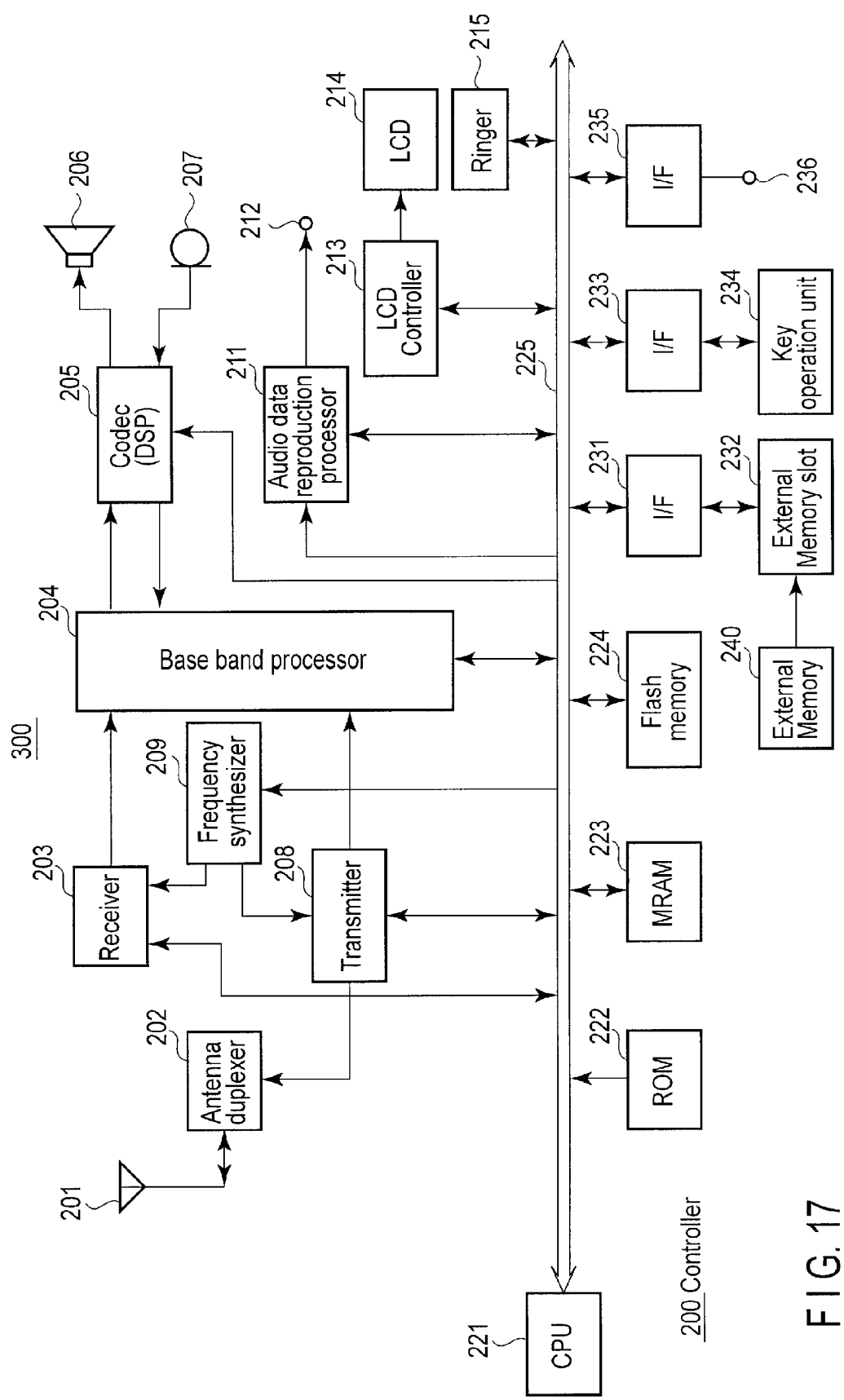
FIG. 17 is a block diagram showing a portable telephone terminal as an application example.

FIG. 17 shows a portable telephone terminal.

The portable telephone terminal is achieved as a microcomputer to which a communication unit and a controller are connected by a bus 225.

The communication unit comprises a transmitting and receiving antenna 201, an antenna duplexer 202, a receiver 203, a base band processor 204, a DSP 205 used as a voice codec, a speaker (telephone receiver) 206, a microphone (telephone transmitter) 207, a transmitter 208 and a frequency synthesizer 209. The controller comprises a CPU 221, a ROM 222, and an MRAM 223 according to the above embodiment and a flash memory 224.

In the ROM 222, data such as a program to be carried out in the CPU 221 or display fonts are stored in advance. The MRAM 223 is used mainly as a working memory which processes data. When the CPU 221 is executing a program, the MRAM 223 temporarily stores data being subjected to a calculation, and also temporarily stores data to be transmitted between the controller and the communication unit.

The flash memory 224 stores, when a power supply of a portable telephone terminal is turned off, for example, set conditions just prior to turning off of the power supply; that is, in order that when the power supply is next turned on, the portable telephone terminal be used under the same set conditions as prior to the turning off of the power supply, the flash memory 224 stores those set parameters. Therefore, even if the power supply of the portable telephone terminal is turned off, the stored set parameters are not lost.

Furthermore, to the portable telephone terminal, an audio data reproduction processor 211, an external output terminal 212, a LCD controller 213, a liquid crystal display (LCD) 214 for display and a ringer 215 which generates a ringing tone are added.

The audio data reproduction processor 211 reproduces audio information input to the portable telephone terminal (or audio information stored in an external memory 240). The reproduced audio information is transmitted to a headphone, a portable speaker or the like through the external output terminal 212. Thereby, voice is output to the outside.

In such a manner, due to provision of the audio data reproduction processor 211, the audio information can be reproduced. The LCD controller 213, for example, receives display information from the CPU 221 through the bus 225, converts it into an LCD control information for controlling the LCD 214, and further drives the LCD 214 to perform a LCD display.

Furthermore, to the portable telephone terminal, interface circuits (I/F) 231, 233 and 235, an external memory 240, an external memory slot 232, a key operation unit 234 and an external input-output terminal 236 are added.

In the external memory slot 232, the external memory 240, which is, e.g., a memory card, is inserted. The external memory slot 232 is connected to the bus 225, with the interface circuit (I/F) 231 interposed between them.

In such a manner, the slot 232 is provided in the portable telephone terminal, thereby enabling internal information of the portable telephone terminal to be written to the external memory 240 or information (e.g., audio information) stored in the external memory 240 to be input to a portable telephone terminal 300.

The key operation unit 234 is connected to the bus 225, with the interface circuit (I/F) 233 interposed between them. Key input information to be input from the key operation unit 234 is transmitted to, e.g., the CPU 221. The external input-output terminal 236 is connected to the bus 225, with the interface circuit (I/F) 233 interposed between them, and also used in inputting information to the portable telephone terminal from the outside or used in inputting information from the portable telephone terminal to the outside.

It should be noted that in the above application example, the ROM 222, the MRAM 223 and the flash memory 224 are used; however, at least one of the ROM 222 and the flash memory 224 can be replaced by an MRAM. Also, for example, the ROM 222 and the flash memory 224 may be omitted.

[MRAM Card]

The following explanation is given with respect to the case where the MRAM according to the embodiment is applied to a card which stores media content, such as a smart medium.

FIG. 18 shows an MRAM card. FIGS. 19-22 show an MRAM card system.

An MRAM card body 400 incorporates an MRAM chip 401. In the card body 400, an opening portion 402 is provided in a position associated with the MRAM chip 401, and the MRAM chip 401 is exposed. At the opening portion 402, a shutter 403 is provided, and protects the MRAM chip 401 when the MRAM card is carried. It is preferable that the shutter 403 be formed of material which can block an external magnetic field, for example, ceramic.

In the case of transferring data, the shutter 403 is made in an opened state to expose the MRAM chip 401. An external terminal 404 is intended to take out content data stored in the MRAM to the outside.

Figure 19:
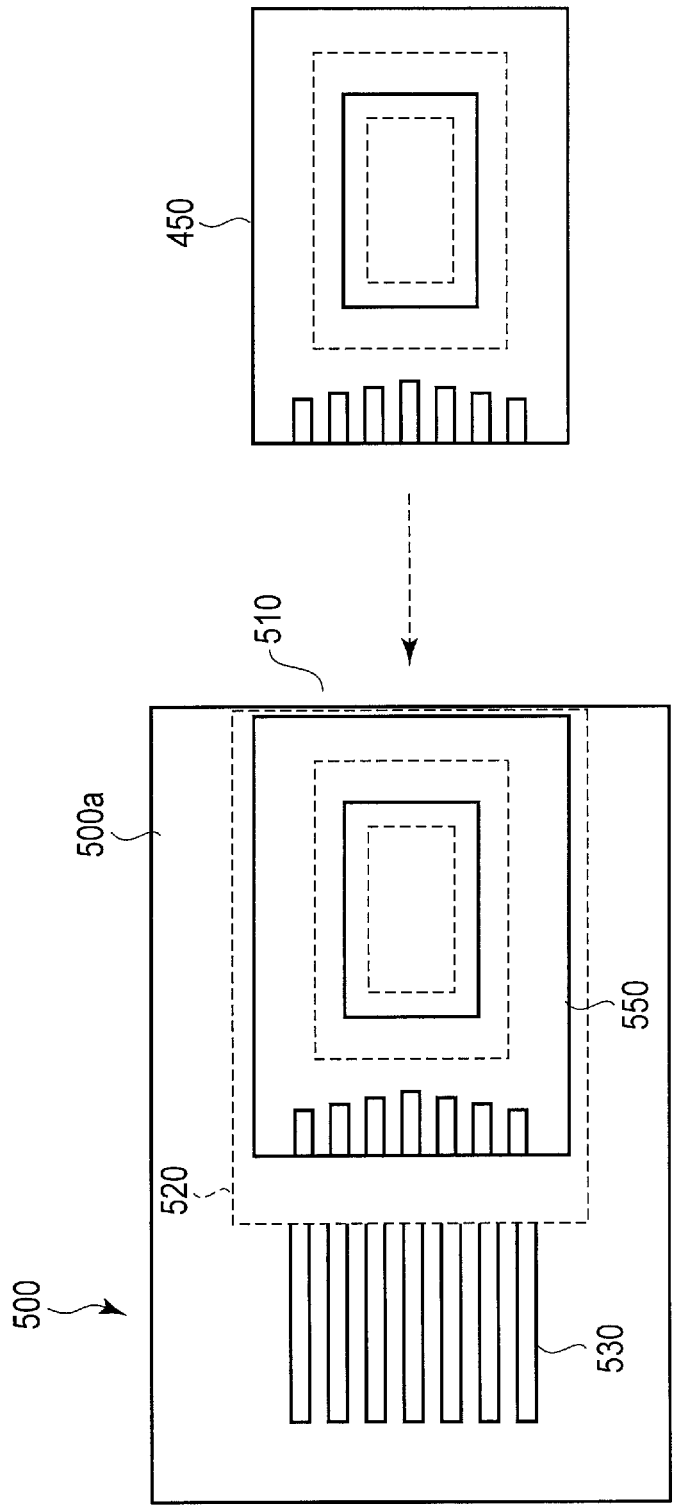

FIGS. 19 and 20 show a transfer device which transfers data to an MRAM card.

This transfer device 500 is of a card insertion type. The transfer device 500 includes an accommodation portion 500*a*. In the accommodation portion 500*a*, a first MRAM card 550 is accommodated. Also, in the accommodation portion 500*a*, an external terminal 530 is provided which is to be electrically connected to the first MRAM card 550, and data of the first MRAM card 550 is rewritten with the external terminal 530.

A second MRAM card 450 for use by an end user is inserted from an insertion portion 510 of the transfer device 500 as indicated by an arrow, and pushed until it is stopped by a stopper 520. The stopper 520 also functions as a member for positioning the first MRAM card 550 and the second MRAM card 450 with respect to each other. When the second MRAM card 450 is positioned in a predetermined position, a control signal is supplied from a controller in the first MRAM card 550 to the external terminal 530, and data stored in the first MRAM card 550 is transferred to the second MRAM card 450.

Figure 21:
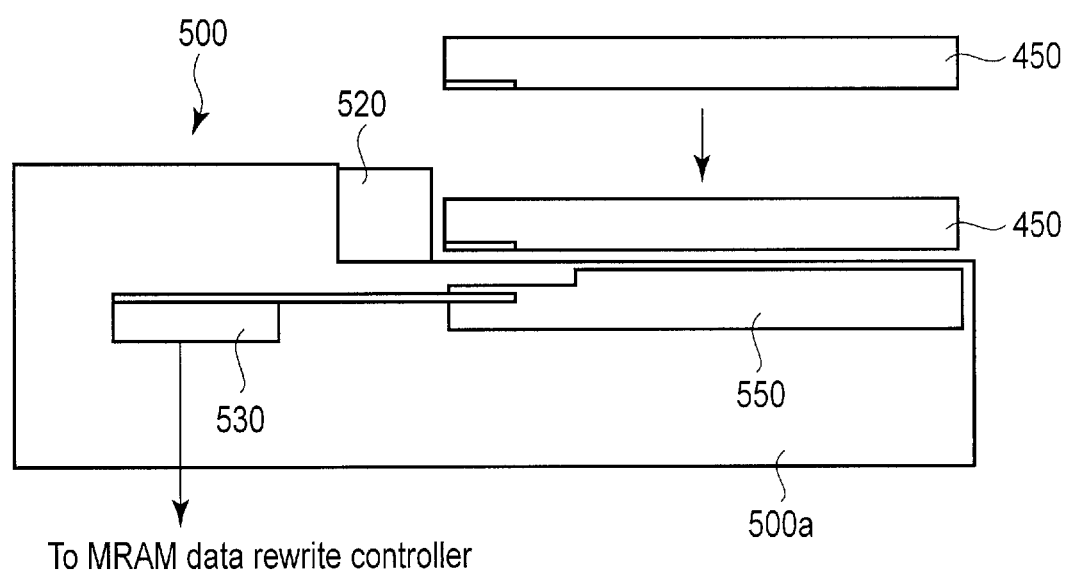

FIG. 21 shows a set-in type transfer device.

The transfer device 500 is of a type in which the second MRAM card 450 is placed on the first MRAM card 550 with respect to the stopper 520 as indicated by an arrow, such that it is set in the device. Its transfer method is the same as that of the card insertion type transfer device, and its explanation will thus be omitted.

FIG. 22 is a slide type transfer device.

In this transfer device 500, a tray-slide 560 is provided as in a CD-ROM drive or a DVD drive, and is moved as indicated by an arrow. When the tray-slide 560 is moved to a position indicated by a broken line, the second MRAM card 450 is placed on the tray-slide 560, and is transferred into the transfer device 500.

A feature in which the second MRAM card 450 is transferred such that its distal end portion thereof comes into contact with the stopper 520 and a transferring method are the same as those of the card-insertion type transfer device, and their explanations will thus be omitted.

3. Conclusion

As described above, according to the embodiment, even if the magnetoresistive element is made more minute, a high retention index (Δ value) and a high MR ratio can be both obtained.

The embodiment brings about significant advantages to industry if it is applied to a high-speed random writable file memory, a portable terminal which can perform a high-speed download, a semiconductor memory for a broadcast equipment, a drive recorder, a home video, a large-capacity buffer memory for communications, and a semiconductor memory for a security camera, etc.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive element comprising:
a first magnetic layer;
a first nonmagnetic insulating layer on the first magnetic layer;
a second magnetic layer on the first nonmagnetic insulating layer;
a second nonmagnetic insulating layer on the second magnetic layer; and
a nonmagnetic conductive layer on the second nonmagnetic insulating layer,
wherein the second nonmagnetic insulating layer includes a first metal oxide with a predetermined element which is one of Ar, Xe and Kr, and the first nonmagnetic insulating layer includes a second metal oxide.

2. The element of claim 1, wherein the first magnetic layer has a perpendicular and invariable magnetization, and the second magnetic layer has a perpendicular and variable magnetization.

3. The element of claim 1, wherein the first metal oxide is the same as the second metal oxide.

4. The element of claim 1, wherein the second nonmagnetic insulating layer includes an element which is included in the nonmagnetic conductive layer.

5. The element of claim 1, wherein the first and second metal oxides are magnesium oxides respectively.

6. The element of claim 1, wherein the first and second metal oxides are materials which are (001)-oriented in a direction in which the first and second magnetic layers are stacked, respectively.

7. The element of claim 1, wherein the second nonmagnetic insulating layer has a resistance lower than a resistance of the first nonmagnetic insulating layer.

8. The element of claim 1, wherein the second nonmagnetic insulating layer includes a portion which is in an amorphous state with an oxygen deficiency.

9. The element of claim 1, wherein the second nonmagnetic insulating layer has a roughness larger than a roughness of the first nonmagnetic insulating layer.

10. The element of claim 1, wherein at least one of the first and second magnetic layers includes a three layer structure which comprises two magnetic layers and a nonmagnetic conductive layer therebetween.

11. The element of claim 1, wherein the first nonmagnetic insulating layer does not include the predetermined element.

12. A method of manufacturing a magnetoresistive element, wherein the magnetoresistive element comprises:
   a first magnetic layer;
   a first nonmagnetic insulating layer on the first magnetic layer;
   a second magnetic layer on the first nonmagnetic insulating layer;
   a second nonmagnetic insulating layer on the second magnetic layer; and
   a nonmagnetic conductive layer on the second nonmagnetic insulating layer;
   wherein the second nonmagnetic insulating layer includes a first metal oxide with a predetermined element, and the first nonmagnetic insulating layer includes a second metal oxide;
   the method comprising:
   forming the first nonmagnetic insulating layer on the first magnetic layer;
   forming the second magnetic layer on the first nonmagnetic insulating layer;
   forming the second nonmagnetic insulating layer on the second magnetic layer;
   irradiating an ion of the predetermined element in the second nonmagnetic insulating layer; and
   forming the nonmagnetic conductive layer on the second nonmagnetic insulating layer after irradiating the ion of the predetermined element.

13. A method of manufacturing a magnetoresistive element, wherein the element magnetoresistive comprises:
   a first magnetic layer;
   a first nonmagnetic insulating layer on the first magnetic layer;
   a second magnetic layer on the first nonmagnetic insulating layer;
   a second nonmagnetic insulating layer on the second magnetic layer; and
   a nonmagnetic conductive layer on the second nonmagnetic insulating layer;
   wherein the second nonmagnetic insulating layer includes a first metal oxide with a predetermined element, and the first nonmagnetic insulating layer includes a second metal oxide;
   the method comprising:
   forming the first nonmagnetic insulating layer on the first magnetic layer;
   forming the second magnetic layer on the first nonmagnetic insulating layer;
   forming the second nonmagnetic insulating layer on the second magnetic layer;
   forming the nonmagnetic conductive layer on the second nonmagnetic insulating layer; and
   irradiating an ion of the predetermined element in the second nonmagnetic insulating layer from above the nonmagnetic conductive layer.

14. A magnetoresistive element comprising:
   a nonmagnetic conductive layer;
   a first nonmagnetic insulating layer on the nonmagnetic conductive layer;
   a first magnetic layer on the first nonmagnetic insulating layer;
   a second nonmagnetic insulating layer on the first magnetic layer; and
   a second magnetic layer on the second nonmagnetic insulating layer,
   wherein the first nonmagnetic insulating layer includes a first metal oxide with a predetermined element which is one of Ar, Xe and Kr, and the second nonmagnetic insulating layer includes a second metal oxide.

15. The element of claim 14, wherein the first magnetic layer has a perpendicular and variable magnetization, and the second magnetic layer has a perpendicular and invariable magnetization.

16. The element of claim 14, wherein the first metal oxide is the same as the second metal oxide.

17. The element of claim 14, wherein the first and second metal oxides are magnesium oxides respectively.

18. The element of claim 14, wherein the first and second metal oxides are materials which are (001)-oriented in a direction in which the first and second magnetic layers are stacked, respectively.

19. The element of claim 14, wherein the first nonmagnetic insulating layer has a resistance lower than a resistance of the second nonmagnetic insulating layer.

20. The element of claim 14, wherein the first nonmagnetic insulating layer includes a portion which is in an amorphous state with an oxygen deficiency.

21. The element of claim 14, wherein the first nonmagnetic insulating layer has a roughness larger than a roughness of the second nonmagnetic insulating layer.

22. The element of claim 14, wherein at least one of the first and second magnetic layers includes a three layer structure which comprises two magnetic layers and a nonmagnetic conductive layer therebetween.

23. The element of claim 14, wherein the second nonmagnetic insulating layer does not include the predetermined element.

24. A method of manufacturing a magnetoresistive element, wherein the magnetoresistive element comprises:
   a nonmagnetic conductive layer;
   a first nonmagnetic insulating layer on the nonmagnetic conductive layer;
   a first magnetic layer on the first nonmagnetic insulating layer;
   a second nonmagnetic insulating layer on the first magnetic layer; and
   a second magnetic layer on the second nonmagnetic insulating layer;
   wherein the first nonmagnetic insulating layer includes a first metal oxide with a predetermined element, and the second nonmagnetic insulating layer includes a second metal oxide;
   the method comprising:
   forming the first nonmagnetic insulating layer on the nonmagnetic conductive layer;
   irradiating an ion of the predetermined element in the first nonmagnetic insulating layer;
   forming the first magnetic layer on the first nonmagnetic insulating layer after irradiating the ion of the predetermined element;
   forming the second nonmagnetic insulating layer on the first magnetic layer; and
   forming the second magnetic layer on the second nonmagnetic insulating layer.

* * * * *